US012689357B2

(12) United States Patent
    Khawas et al.

(10) Patent No.: US 12,689,357 B2
(45) Date of Patent: Jul. 21, 2026

(54) SYNCHRONIZER FLIP-FLOP CIRCUIT

(71) Applicant: TEXAS INSTRUMENTS INCORPORATED, Dallas, TX (US)

(72) Inventors: Arnab Khawas, Bangalore (IN); Gokul Sabada, Bangalore (IN); Badarish Subbannavar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 125 days.

(21) Appl. No.: 18/458,703

(22) Filed: Aug. 30, 2023

(65) Prior Publication Data

US 2025/0080093 A1      Mar. 6, 2025

(51) Int. Cl.
*H03K 3/3562* (2006.01)
*H03K 3/012* (2006.01)
*H03K 3/037* (2006.01)

(52) U.S. Cl.
CPC ......... *H03K 3/35625* (2013.01); *H03K 3/012* (2013.01); *H03K 3/0372* (2013.01)

(58) Field of Classification Search
CPC ... H03K 3/35625; H03K 3/012; H03K 3/0372
See application file for complete search history.

(56) References Cited

U.S. PATENT DOCUMENTS

| | | | |
|---|---|---|---|
| 2010/0007382 A1* | 1/2010 | Hashimoto .......... | H10D 84/859 |
| | | | 326/122 |
| 2014/0132306 A1* | 5/2014 | Fechner .................. | H03K 3/01 |
| | | | 326/103 |

| | | | |
|---|---|---|---|
| 2014/0368284 A1 | 12/2014 | Luo et al. | |
| 2019/0393876 A1* | 12/2019 | Tripathi ............. | H03K 19/0005 |
| 2020/0186131 A1 | 6/2020 | Rengarajan et al. | |
| 2021/0126628 A1* | 4/2021 | Hong ................... | H03K 3/0372 |
| 2022/0385277 A1* | 12/2022 | Lim ..................... | H03K 3/3562 |

FOREIGN PATENT DOCUMENTS

| | | |
|---|---|---|
| JP | 2016082533 A | 5/2016 |
| KR | 101102614 B1 | 1/2012 |

OTHER PUBLICATIONS

International PCT Search Report for PCT/US2023/086335 dated May 24, 2024.

* cited by examiner

*Primary Examiner* — Sibin Chen
(74) *Attorney, Agent, or Firm* — Michelle Murray; Frank D. Cimino

(57) ABSTRACT

Embodiments disclosed herein relate to synchronizing signals across multiple independent clock domains. In an example, a synchronizer flip-flop circuit is provided. The synchronizer flip-flop circuit includes a first latch sub-circuit coupled to receive an input and a second latch sub-circuit coupled to the first latch sub-circuit. The first latch sub-circuit includes a first group of inverters, a first diode-connected transistor coupled in parallel to each inverter of the first group of inverters and configured to provide a first bias voltage to each inverter of the first group of inverters, and a second diode-connected transistor coupled in parallel to each inverter of the first group of inverters and configured to provide a second bias voltage to each inverter of the first group of inverters.

16 Claims, 4 Drawing Sheets

SYNCHRONIZER FLIP-FLOP CIRCUIT

TECHNICAL FIELD

This relates generally to flip-flop circuits for synchronizing data among multiple clock domains.

BACKGROUND

In electronic systems including digital circuits and integrated circuits, clock signals produced by an oscillator can be used to synchronize functions of the circuitry. In essence, clock signals help circuits act or reset at the same time, which can improve performance of individual circuits and an electronic system overall. A clock signal is an electronic logic signal that transitions between a logical low state ("0"), or "off," and a logical high state ("1"), or "on," based on a duty cycle. During transitional periods between 0 and 1, or a rising edge, and between a 1 and 0, or a falling edge, edge-triggered circuitry can be triggered to become active.

In digital logic circuits, flip-flops and latches can be included to store state information and ensure proper sequencing for logic in electronics. Additionally, flip-flops can be used to synchronize logic among multiple clock domains. The output of a flip-flop may transition (e.g., switch state from "0" to "1" and "1" to "0") at specific times determined based on the state of a clock signal. Outside of these times, the flip-flop retains its current state. In this way, a flip-flop stores state data, such as a "0" or "1" based on the state of the clock signal and the state of a data input.

An example of a flip-flop that may be used for clock domain synchronization is a D flip-flop. A D flip-flop can include multiple stages of latches that each process the clock signal and a data signal. As the data signal changes states, the latches can store the latest state of the data signal. Some examples of D flip-flops further include primary latches and secondary latches, which can each include multiple inverters capable of storing state information. The primary latch can control the output value of the secondary latch, or in other words, which state to store at a given time, as the secondary latch changes its value only in response to a change in the value of the primary latch.

Problematically, however, various synchronizer flip-flops existing today, including D flip-flops suffer from latency that affects the speed at which a flip-flop can stabilize and store data as states of the data input and clock signal change states. Some solutions to this issue introduce higher number of inverter stages in a flip-flop to increase the mean time between failure, or the amount of time between expected failures of the flip-flop. However, this requires additional area and cost.

SUMMARY

Various embodiments disclosed herein relate to flip-flop circuits for synchronizing data across circuits operating in different clock domains, and more particularly, to providing bias voltages to inverters of a flip-flop circuit to reduce a threshold voltage of transistors of the inverters and increase data latching efficiency of the inverters. In an example embodiment, a circuit device is provided. The circuit device includes a first latch sub-circuit coupled to receive an input and a second latch sub-circuit coupled to the first latch sub-circuit. The first latch sub-circuit includes a first set of inverters that includes a first set of transistors of a first type and a second set of transistors of a second type, a first diode-connected transistor coupled to a body of each transistor of the first set of transistors, and a second diode-connected transistor coupled to a body of each transistor of the second set of transistors.

This Summary is provided to introduce a selection of concepts in a simplified form that are further described below in the Detailed Description. It may be understood that this Summary is not intended to identify key features or essential features of the claimed subject matter, nor is it intended to be used to limit the scope of the claimed subject matter.

BRIEF DESCRIPTION OF THE DRAWINGS

The drawings are not necessarily drawn to scale. In the drawings, like reference numerals designate corresponding parts throughout the several views. In some embodiments, components or operations may be separated into different blocks or may be combined into a single block.

DETAILED DESCRIPTION

Figure 1:
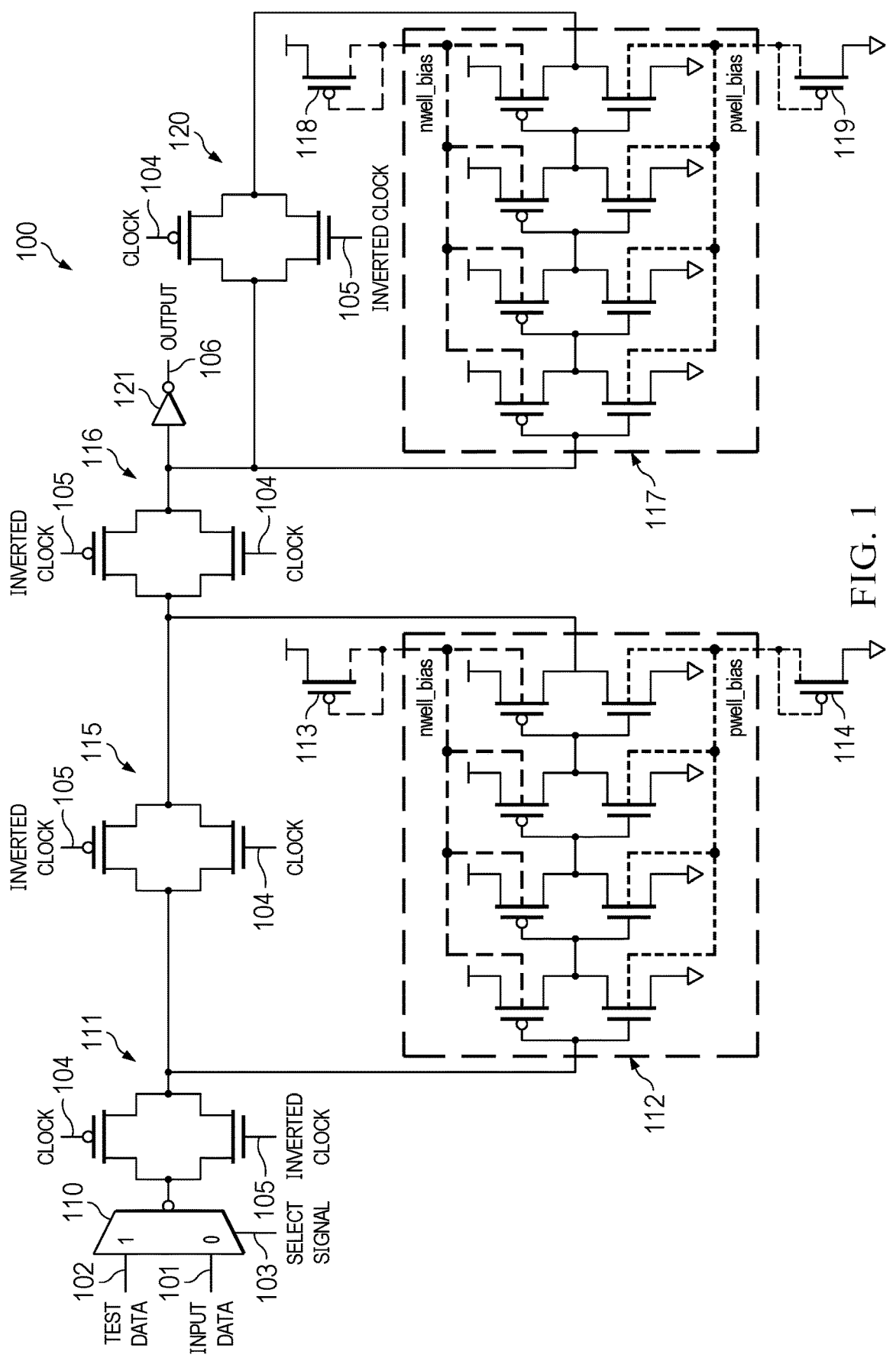
FIG. 1 illustrates an example synchronizer flip-flop circuit in accordance with an embodiment.

Embodiments of the present disclosure are described in specific contexts, such as in synchronizer flip-flop circuits, primary-secondary latch circuits, digital logic and inverter circuitry, and the like. Some embodiments may use other circuits, digital logic components, topologies, and applications that exhibit increased transistor efficiency, increased mean-time between failure, and other characteristics based on decreasing threshold voltages of transistors.

Discussed herein are enhanced components, techniques, and systems related to flip-flop circuits used for synchronizing logic across circuits operating in different clock domains relative to one another, and more particularly, to providing bias voltages to inverters of a flip-flop circuit to reduce a threshold voltage of transistors of the inverters and increase latching resolution efficiency of the inverters when operating to synchronize such logic. In an electronic system, a clock generation system can provide a clock signal that can be used to synchronize the actions of digital circuitry. Importantly, synchronizing digital circuitry to the clock signal allows digital circuitry components to perform sequential logic operations, among other functions. To do so, flip-flops and latches can be implemented to store state data for the digital circuitry. In a system including multiple digital circuits that each operate in conjunction with a different clock signal, or in other words, in different clock domains, synchronizer flip-flops can be used to synchronize data signals that may be provided from a digital circuit in one clock domain to a digital circuit in another clock domain (i.e., across clock domains).

Flip-flops and latches are examples of logic components within digital circuitry that can store state data (e.g., "0" or "1") based on inputs to the flip-flops (e.g., an input data signal) at times dictated by a clock signal. Some example flip-flops include one or more inverters that can be triggered by a clock signal to store the state of the input data signal.

Inverters may take some time to resolve, or, to store the state data following a change in state from 0 to 1 or from 1 to 0. By way of example, a flip-flop may currently be storing a value of 1. When the data signal changes from 1 to 0, the flip-flop may then be triggered to store a value of 0. However, for some time, the output of the flip-flop may be in a metastable state where the value is between 0 and 1. The time it takes the flip-flop to resolve a metastable output and store the new value of 0 may be referred to as the resolution time. If the inverter does not resolve quickly enough, a digital circuit performing logic dependent on the state data may fail. The amount of time between such failures may be referred to as mean time between failure (MTBF). To increase the MTBF, example flip-flops may use large numbers of inverters to help ensure that the inverters resolve data before a failure. Problematically, however, increasing the number of inverters in a flip-flop can increase latency in the design of the overall digital circuit, cost by way of additional components, and area overhead with respect to the number of signals crossing clock domains.

Instead, as disclosed herein, a synchronizer flip-flop can include two or more inverters coupled in series or in a multi-stage, or split-stage, inverter scheme. Each inverter can include two transistors coupled together, and each transistor can be fed a bias voltage by a diode-connected transistor. The bias voltage can decrease the threshold voltage of each transistor of the inverters, which can effectively reduce the time required for the transistor to resolve data when a data signal changes states from a 0 to a 1 or from a 1 to a 0. Advantageously, such a circuit can reduce latency within the flip-flop circuit, latency within an overall digital circuit that implements logic based on the data stored by the flip-flop circuit, and design cost by avoiding large numbers of inverters and by creating such bias voltages without the use of external power supplies.

In an example embodiment, a circuit device is provided. The circuit device includes a first latch sub-circuit coupled to receive an input and a second latch sub-circuit coupled to the first latch sub-circuit. The first latch sub-circuit includes a first set of inverters that includes a first set of transistors of a first type and a second set of transistors of a second type, a first diode-connected transistor coupled to a body of each transistor of the first set of transistors, and a second diode-connected transistor coupled to a body of each transistor of the second set of transistors.

In another example embodiment, a synchronizer flip-flop circuit is provided. The synchronizer flip-flop circuit includes a first latch sub-circuit coupled to receive an input and a second latch sub-circuit coupled to the first latch sub-circuit. The first latch sub-circuit includes a first group of inverters, a first diode-connected transistor coupled in parallel to each inverter of the first group of inverters and configured to provide a first bias voltage to each inverter of the first group of inverters, and a second diode-connected transistor coupled in parallel to each inverter of the first group of inverters and configured to provide a second bias voltage to each inverter of the first group of inverters.

In yet another example embodiment, a synchronizer flip-flop circuit is provided. The synchronizer flip-flop circuit includes a first latch sub-circuit coupled to receive an input and a second latch sub-circuit coupled to the first latch sub-circuit. The first latch sub-circuit includes a first group of inverters, a first diode-connected transistor coupled in parallel to each inverter of the first group of inverters and configured to provide a first bias voltage to each inverter of the first group of inverters, and a second diode-connected transistor coupled in parallel to each inverter of the first group of inverters and configured to provide a second bias voltage to each inverter of the first group of inverters. The second latch sub-circuit includes a second group of inverters, a third diode-connected transistor coupled in parallel to each inverter of the second group of inverters and configured to provide a third bias voltage to each inverter of the second group of inverters, and a fourth diode-connected transistor coupled in parallel to each inverter of the second group of inverters and configured to provide a fourth bias voltage to each inverter of the second group of inverters.

FIG. 1 illustrates an example synchronizer flip-flop circuit in accordance with an embodiment. FIG. 1 includes synchronizer flip-flop circuit 100, which includes multiplexer 110, transmission gates 111, 115, 116, and 120, primary latch sub-circuit 112, diode-connected transistors 113 and 114, secondary latch sub-circuit 117, diode-connected transistors 118 and 119, and logic device 121.

Synchronizer flip-flop 100 is representative of a two-latch (i.e., master-slave latches) circuit capable of resolving a single bit-level signal (input data 101) provided by a digital circuit (not shown). Synchronizer flip-flop 100 may be used to store a state (e.g., "0", "1") of input data 101 and provide the stored state data downstream to a different digital circuit (not shown) operating in a different clock domain with respect to the digital circuit providing synchronizer flip-flop 100 with input data 101. Accordingly, synchronizer flip-flop 100 may be used to synchronize a signal used by two or more digital circuits of differing clock domains to a single clock cycle.

Synchronizer flip-flop 100 includes multiplexer 110, which can be coupled to receive input data 101 (from a digital circuit), test data 102 (e.g., scan input data), and select signal 103 and coupled to provide either input data 101 or test data 102 to elements of synchronizer flip-flop 100 based on a state of select signal 103. Input data 101, test data 102, and select signal 103 may each be signals that include a value indicative of a logical low state (i.e., "0") or a logical high state (i.e., "1"). When select signal 103 is low, multiplexer 110 may provide input data 101 to transmission gate 111 for storing in the synchronizer flip-flop 100. When select signal 103 is high, multiplexer 110 may provide test data 102 to transmission gate 111 for storing in the synchronizer flip-flop 100 for use during a test routine (e.g., to ensure proper functionality of one or more elements of synchronizer flip-flop 100). The state of select signal 103 may be controlled by a controller or other circuit (not shown).

Input data 101 is an electronic logic signal having a state (e.g., logical high state, logical low state) of which synchronizer flip-flop 100 is to store for use by other digital circuits. In various examples, synchronizer flip-flop 100 may be triggered to store the last state value of input data 101 until the state of input data 101 changes. For example, if, at an initial time, input data 101 is in the logical low state, synchronizer flip-flop 100 can store a "0" in elements of synchronizer flip-flop 100. At a subsequent time, when input data 101 changes from the logical low state to the logical high state, and select signal 103 is low, synchronizer flip-flop 100 can be configured to store a "1" in elements of synchronizer flip-flop 100.

Transmission gate 111 can be coupled to receive input data 101 from multiplexer 110 when select signal 103 is in the high logical state. Transmission gate 111 includes two transistors coupled together. More specifically, a first transistor of transmission gate 111 may include a n-channel (or n-type) metal-oxide semiconductor field-effect transistor (MOSFET) (also referred to as a NMOS), and a second transistor of transmission gate 111 may include a p-channel (or p-type) MOSFET (also referred to as a PMOS). Each transistor may include a drain, a source, and a gate. The drains and sources of the transistors may be coupled together. The gate of the PMOS transistor can be coupled to receive clock 104 (i.e., a clock signal) from a timing circuit (not shown). The gate of the NMOS transistor can be coupled to receive inverted clock 105 (i.e., an inverted clock signal) from the timing circuit that substantially aligned with and opposite clock 104. When clock 104 is in the low logical state ("0"), inverted clock 105 is in the high logical state ("1"), and transmission gate 111 may operate in a conductive mode whereby transmission gate 111 can pass input data 101 to primary latch sub-circuit 112 and to transmission gate 115. When clock 104 is in the high logical state and inverted clock 105 is in the low logical state, transmission gate 111 may stop conducting and block a signal (e.g., input data 101 or test data 102) from flowing to primary latch sub-circuit 112 and transmission gate 115.

Primary latch sub-circuit 112 is representative of a first or primary control flip-flop including a first group of inverters that can control operations of secondary latch sub-circuit 117, or a secondary group of inverters following the first group of inverters. Together, the inverters of primary latch sub-circuit 112 can receive input data 101, store a state value (e.g., "0" or "1") of input data 101, and provide the state value to transmission gate 116 and further downstream to another digital circuit (not shown) (e.g., output 106) and/or to secondary latch sub-circuit 117. Primary latch sub-circuit 112 can be configured to store a subsequent state value of input data 101 when the state of input data 101 changes to a different state relative to its stored state. Following the latching of a new state of input data 101, primary latch sub-circuit 112 can provide the new state value to secondary latch sub-circuit 117 for storage.

In this example, primary latch sub-circuit 112 includes four inverters coupled in series. However, other numbers of inverters may be used in other embodiments. Each inverter includes an NMOS transistor and a PMOS transistor coupled together. More specifically, the gates of the NMOS and PMOS transistors of the first inverter in primary latch sub-circuit 112 may both be coupled to receive input data 101 from transmission gate 111, and the drain of the NMOS transistor and the drain of the PMOS transistor may be coupled together to the gate of a subsequent inverter in primary latch sub-circuit 112. Each source of the PMOS transistors in primary latch sub-circuit 112 may be coupled to receive a power from an internal power supply (e.g., $V_{dd}$). Each source of the NMOS transistors in primary latch sub-circuit 112 may be coupled to individual ground nodes.

Resolving the storage of a new state value via primary latch sub-circuit 112 may take time. However, to avoid taking too much time, which may cause a failure in digital logic circuitry external to synchronizer flip-flop 100, diode-connected transistors 113 and 114 are included in synchronizer flip-flop 100 and are coupled to provide body bias voltages to the inverters of primary latch sub-circuit 112. Diode-connected transistor 113 may be a PMOS transistor, and diode-connected transistor 114 may be an NMOS transistor. Both the drain and the gate of diode-connected transistor 113 may be coupled to a body of each PMOS transistor of the inverters of primary latch sub-circuit 112. The source of diode-connected transistor 113 can be coupled to an internal power supply of synchronizer flip-flop 100 (e.g., $V_{dd}$). Similarly, the drain and the gate of diode-connected transistor 114 may be coupled to a body of each NMOS transistor of the inverters of primary latch sub-circuit 112. The source of diode-connected transistor 114 can also be coupled to a ground node. Accordingly, diode-connected transistors 113 and 114 can generate a n-channel well bias voltage and a p-channel well bias voltage, respectively, on-the-fly during operation of synchronizer flip-flop 100 (i.e., during state switching of input data 101), which may reduce the threshold voltages of the NMOS and PMOS transistors of primary latch sub-circuit 112 and increase latching resolution speed of the transistors. Advantageously, not only may the mean time between failure (MTBF) of synchronizer flip-flop 100 be increased using such a topology of primary latch sub-circuit 112, but also the design-level area may be reduced as fewer flip-flop stages may be required and external power supplies may not be used to create bias voltages using diode-connected transistors 113 and 114.

After primary latch sub-circuit 112 stores a state value of input data 101, data input can be provided to transmission gate 116. Transmission gate 116, like transmission gates 111 and 115, includes an NMOS transistor and a PMOS transistor coupled together to form a switch for synchronizer flip-flop 100. When clock 104 is high, input data 101 can be provided to transmission gate 120, also including an NMOS transistor and a PMOS transistor coupled together, and to secondary latch sub-circuit 117. In various examples, secondary latch sub-circuit 117 includes the same topology as primary latch sub-circuit 112. Thus, in this example, secondary latch sub-circuit 117 includes four inverters coupled in series, each inverter having two transistors coupled together (e.g., an NMOS transistor and a PMOS transistor). Likewise, secondary latch sub-circuit 117 is coupled with diode-connected transistors 118 and 119, which can provide p-channel and n-channel well bias voltages, respectively, to PMOS and NMOS transistors of secondary latch sub-circuit 117. In some cases, diode-connected transistors 118 and 119 may be the same devices as diode-connected transistors 113 and 114, respectively. In such cases, diode-connected transistors 113 and 114 may be coupled to provide bias voltages to both primary latch sub-circuit 112 and secondary latch sub-circuit 117 as opposed to including two additional devices (diode-connected transistors 118 and 119). It follows that secondary latch sub-circuit 117 can perform latching of a state value of input data 101, as controlled by primary latch sub-circuit 112, at increased speeds based on the bias voltages provided by diode-connected transistors 118 and 119.

Secondary latch sub-circuit 117 can be coupled to provide the state value of input data 101 to logic device 121 following latching of the latest state value. Logic device 121 is representative of a digital logic device (a NOT gate) that can invert the value and be coupled to provide output 106 to one or more downstream digital circuits (not shown).

In other examples, primary latch sub-circuit 112 and secondary latch sub-circuit 117 may have different topologies individually and/or with respect to each other. For example, each latch sub-circuit may include a different number of inverters, different types of transistors, or the like. Further, in some examples, either primary latch sub-circuit 112 or secondary latch sub-circuit 117 may not be coupled with diode-connected transistors 113 and 114 or 118 and 119, respectively.

Figure 2:
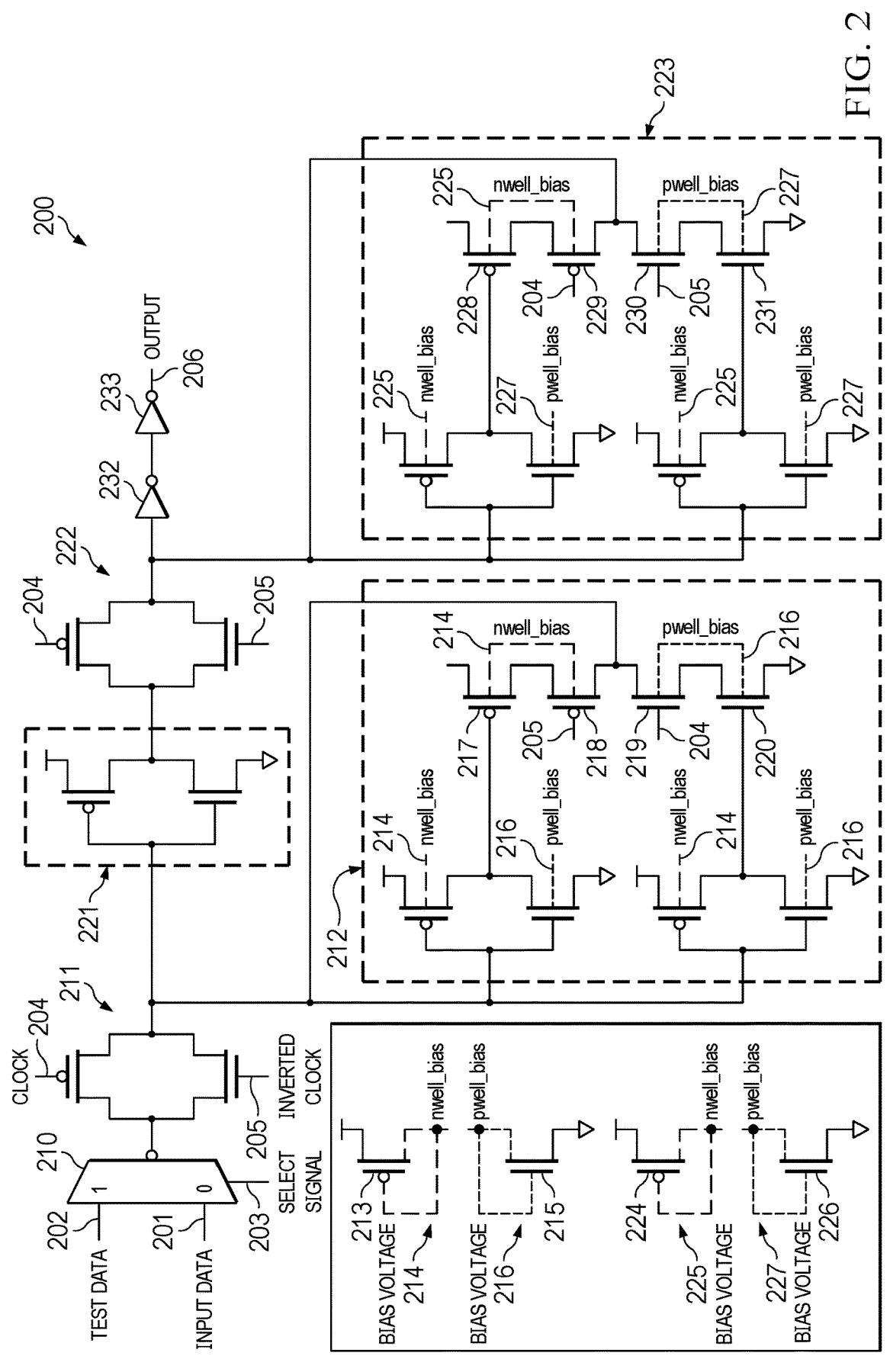
FIG. 2 illustrates an example synchronizer flip-flop circuit in accordance with an embodiment.

FIG. 2 illustrates an example synchronizer flip-flop circuit in accordance with an embodiment. FIG. 2 includes synchronizer flip-flop circuit 200, which includes multiplexer 210, transmission gates 211 and 221, primary latch sub-circuit 212, secondary latch sub-circuit 223, diode-connected transistors 213, 215, 224, and 226, inverter 221, and logic devices 232 and 233.

Synchronizer flip-flop 200 is representative of a two-latch (i.e., master-slave latches) circuit capable of resolving a single bit-level signal (input data 201) provided by a digital circuit (not shown). Synchronizer flip-flop 200 may be used to store a state (e.g., "0", "1") of input data 201 and provide the stored state data downstream to a different digital circuit (not shown) operating in a different clock domain with respect to the digital circuit providing synchronizer flip-flop 200 with input data 201. Accordingly, synchronizer flip-flop 200 may be used to synchronize a signal used by two or more digital circuits of differing clock domains to a single clock cycle.

Synchronizer flip-flop 200 includes multiplexer 210, which can be coupled to receive input data 201 (from a digital circuit), test data 202, and select 203 and coupled to provide either input data 201 or test data 202 to elements of synchronizer flip-flop 200 based on a state of select 203. Input data 201, test data 202, and select 203 may each include signals including a value indicative of a logical low state (i.e., "0") or a logical high state (i.e., "1"). When select 203 is low, multiplexer 210 may provide input data 201 to transmission gate 211 to enable data latching functionality of synchronizer flip-flop 200. When select 203 is high, multiplexer 210 may provide test data 202 to transmission gate 211 to enable testing functionality of synchronizer flip-flop 200 and ensure proper functionality of one or more elements of synchronizer flip-flop 200. The state of select 203 may be controlled by a controller or other circuit (not shown).

Input data 201 indicates an electronic logic signal having a state of which synchronizer flip-flop 200 is to store for use by other digital circuits. In various examples, synchronizer flip-flop 200 may be triggered to store the last state value of input data 201 until the state of input data 201 changes. For example, if, at an initial time, input data 201 is in the logical low state, synchronizer flip-flop 200 can store a "0" in elements of synchronizer flip-flop 200. At a subsequent time, when input data 201 changes from the logical low state to the logical high state, and select 203 is low, synchronizer flip-flop 200 can be configured to store a "1" in elements of synchronizer flip-flop 200.

Transmission gate 211 can be coupled to receive input data 201 from multiplexer 210 when select 203 is in the low logical state. Transmission gate 211 includes two transistors coupled together. More specifically, a first transistor of transmission gate 211 may include an NMOS transistor, and a second transistor of transmission gate 211 may include a PMOS transistor. Each transistor may include a drain, a source, and a gate. The drains and sources of the transistors may be coupled together. The gate of the PMOS transistor can be coupled to receive clock 204 (i.e., a clock signal) from a timing circuit (not shown). The gate of the NMOS transistor can be coupled to receive inverted clock 205 (i.e., an inverted clock signal) from the timing circuit. When clock 204 is in the low logical state, inverted clock 205 is in the high logical state, and transmission gate 211 may operate in a conductive mode whereby transmission gate 211 can pass input data 201 to primary latch sub-circuit 212 and to inverter 221. When clock 204 is in the high logical state and inverted clock 205 is in the low logical state, transmission gate 211 may stop conducting and block a signal from flowing to primary latch sub-circuit 212 and inverter 221.

Primary latch sub-circuit 212 is representative of a first, control flip-flop including a first group of inverters that can control operations of secondary latch sub-circuit 223, or a second group of inverters following the first group of inverters. Together, the inverters of primary latch sub-circuit 212 can receive input data 201, store a state value (e.g., "0"

or "1") of input data 201, and provide the state value to inverter 221 and further downstream to another digital circuit (not shown) (e.g., output 206) and/or to transmission gate 222 and secondary latch sub-circuit 223. Primary latch sub-circuit 212 can be configured to store a subsequent state value of input data 201 when the state of input data 201 changes to a different state relative to its stored state. Following the latching of a new state of input data 201, primary latch sub-circuit 212 can provide the new state value to secondary latch sub-circuit 217 for storage.

In this example, primary latch sub-circuit 212 includes two inverters coupled in a multi-stage inverter topology, however, other numbers of inverters may be used in other embodiments. The inverters are further coupled with diode-connected transistors 213 and 215 and are further coupled to feed a signal to transistors 217 and 218 and 219 and 220, respectively. Each inverter includes an NMOS transistor and a PMOS transistor coupled together. More specifically, with respect to a first inverter, the gates of each transistor may both be coupled to receive input data 201 from transmission gate 211 and the sources of the transistors may both be coupled to the gate of transistor 217. The source of the PMOS transistor may be coupled to receive power from an internal power supply (e.g., $V_{dd}$), and the source of the NMOS transistor may be coupled to a ground node. Likewise, with respect to a second inverter, the gates of each transistor may both be coupled to receive input data 201 from transmission gate 211 and the sources of the transistors may both be coupled to the gate of transistor 220. The source of the PMOS transistor may be coupled to receive power from an internal power supply (e.g., $V_{dd}$), and the source of the NMOS transistor may be coupled to a ground node. The bodies of the PMOS transistors of each inverter may be coupled to receive bias voltage 214 from diode-connected transistor 213. The bodies of the NMOS transistors of each inverter may be coupled to receive bias voltage 216 from diode-connected transistor 215.

Transistors 217 and 218 are coupled to receive a signal from the first inverter of primary latch sub-circuit 212 and provide the signal to inverter 221. In various examples, transistors 217 and 218 may be PMOS transistors. Transistors 217 and 218 may be coupled together at a source of transistor 217 and a drain of transistor 218. Further the bodies of transistors 217 and 218 may both be coupled to receive bias voltage 214 from diode-connected transistor 213. Similarly, transistors 219 and 220 are coupled to receive a signal from the second inverter of primary latch sub-circuit 212 and provide the signal to inverter 221. In various examples, transistors 219 and 220 may be NMOS transistors. Transistors 219 and 220 may be coupled together at a source of transistor 219 and a drain of transistor 220. The gates of transistor 218 and 219 may be coupled to receive inverted clock 205 and clock 204, respectively. The bodies of transistors 219 and 220 may both be coupled to receive bias voltage 216 from diode-connected transistor 215. Transistors 218 and 219 may be coupled together at a drain of transistor 218 and a drain of transistor 219, which forms a node between the two inverters of primary latch sub-circuit 212 that allows the state value resolved and stored by primary latch sub-circuit 212 to be provided to inverter 221.

Resolving the storage of a new state value via primary latch sub-circuit 212 may take time. However, to avoid taking too much time, which may cause a failure in digital logic circuitry external to synchronizer flip-flop 200, diode-connected transistors 213 and 215 are included in synchronizer flip-flop 200 and are coupled to provide bias voltages to the inverters of primary latch sub-circuit 212. Diode-connected transistor 213 may be a PMOS transistor, and diode-connected transistor 215 may be an NMOS transistor. Both the drain and the gate of diode-connected transistor 213 may be coupled to a body of each PMOS transistor of primary latch sub-circuit 212. The source of diode-connected transistor 213 can be coupled to an internal power supply of synchronizer flip-flop 200 (e.g., $V_{dd}$), so no secondary power supply may be required. Similarly, the drain and the gate of diode-connected transistor 215 may be coupled to a body of each NMOS transistor of primary latch sub-circuit 212. The source of diode-connected transistor 215 can also be coupled to a ground node of synchronizer flip-flop 200. Accordingly, diode-connected transistors 213 and 215 can generate a n-channel well bias voltage and a p-channel well bias voltage, respectively, on-the-fly during operation of synchronizer flip-flop 200 (i.e., during state switching of input data 201), which may reduce the threshold voltages of the NMOS and PMOS transistors of primary latch sub-circuit 212 and increase latching resolution speed of the transistors. Advantageously, not only may the mean time between failure (MTBF) of synchronizer flip-flop 200 be increased using such a topology of primary latch sub-circuit 212, but also the design-level area may be reduced as fewer flip-flop stages may be required and external power supplies may not be used to create bias voltages using diode-connected transistors 213 and 215.

After primary latch sub-circuit 212 stores a state value of input data 201, input data 201 can be provided to inverter 221. Inverter 221, like the inverters of primary latch sub-circuit 212, includes an NMOS transistor and a PMOS transistor coupled together. More specifically, the gates of the NMOS transistor and PMOS transistor may be coupled together and to transmission gate 211 and primary latch sub-circuit 212. The source of the PMOS transistor may be coupled to receive a power from an internal power supply. The source of the NMOS transistor may be coupled to a ground node. The drain of the PMOS transistor and the drain of the NMOS transistor may be coupled together and to transmission gate 222. Inverter 221 can be configured to receive input data 201 stored by primary latch sub-circuit 212 and provide the state value to transmission gate 222.

Transmission gate 222, like transmission gate 211, includes a PMOS transistor and an NMOS transistor coupled together to form a switch for synchronizer flip-flop 200. When clock 204 is high, input data 201 can be provided to secondary latch sub-circuit 223 and to logic device 232.

In various examples, secondary latch sub-circuit 223 includes the same topology as primary latch sub-circuit 212. Thus, in this example, secondary latch sub-circuit 223 includes two inverters coupled in a multi-stage inverter topology, each inverter having two transistors coupled together (e.g., an NMOS transistor and a PMOS transistor). A first inverter may be further coupled with transistors 228 and 229, and a second inverter may be further coupled with transistors 230 and 231. However, the gates of transistors 229 and 230 of secondary latch sub-circuit 223 may be coupled to receive clock 204 and inverted clock 205, respectively, which differs from transistors 218 and 219 of primary latch sub-circuit 212. Transistors 228 and 229, which may be PMOS transistors, may be coupled to receive bias voltage 225 from diode-connected transistor 224. The NMOS transistors of secondary latch sub-circuit 223 (e.g., transistors 230 and 231) may be coupled to receive bias voltage 227 from diode-connected transistor 226. Diode-connected transistors 224 and 226 can provide n-channel (e.g., bias voltage 225) and p-channel (e.g., bias voltage 227) well bias voltages, respectively, to transistors of secondary latch sub-circuit 223. In some cases, diode-connected transistors 224 and 226 may be the same devices as diode-connected transistors 213 and 215, respectively. In such cases, diode-connected transistors 213 and 215 may be coupled to provide bias voltages to both primary latch sub-circuit 212 and secondary latch sub-circuit 223 as opposed to including two additional devices (diode-connected transistors 224 and 226). It follows that secondary latch sub-circuit 223 can perform latching of a state value of input data 201, as controlled by primary latch sub-circuit 212, at increased speeds based on the bias voltages 225 and 227 provided by diode-connected transistors 224 and 226, respectively.

Secondary latch sub-circuit 223 can be coupled to provide the state value of input data 201 to logic device 232 (a NOT gate). Logic device 232 can invert the state value and provide the inverted state value to logic device 233 (also a NOT gate). Logic device 233 can further invert the state value. Logic device 233 can be coupled to provide output 206 to one or more downstream digital circuits (not shown).

In other examples, primary latch sub-circuit 212 and secondary latch sub-circuit 223 may have different topologies individually and/or with respect to each other. For example, each latch sub-circuit may include a different number of inverters, different types of transistors, or the like. Further, in some examples, either primary latch sub-circuit 212 or secondary latch sub-circuit 217 may not be coupled with diode-connected transistors 213 and 215 or 224 and 226, respectively.

Figure 3:
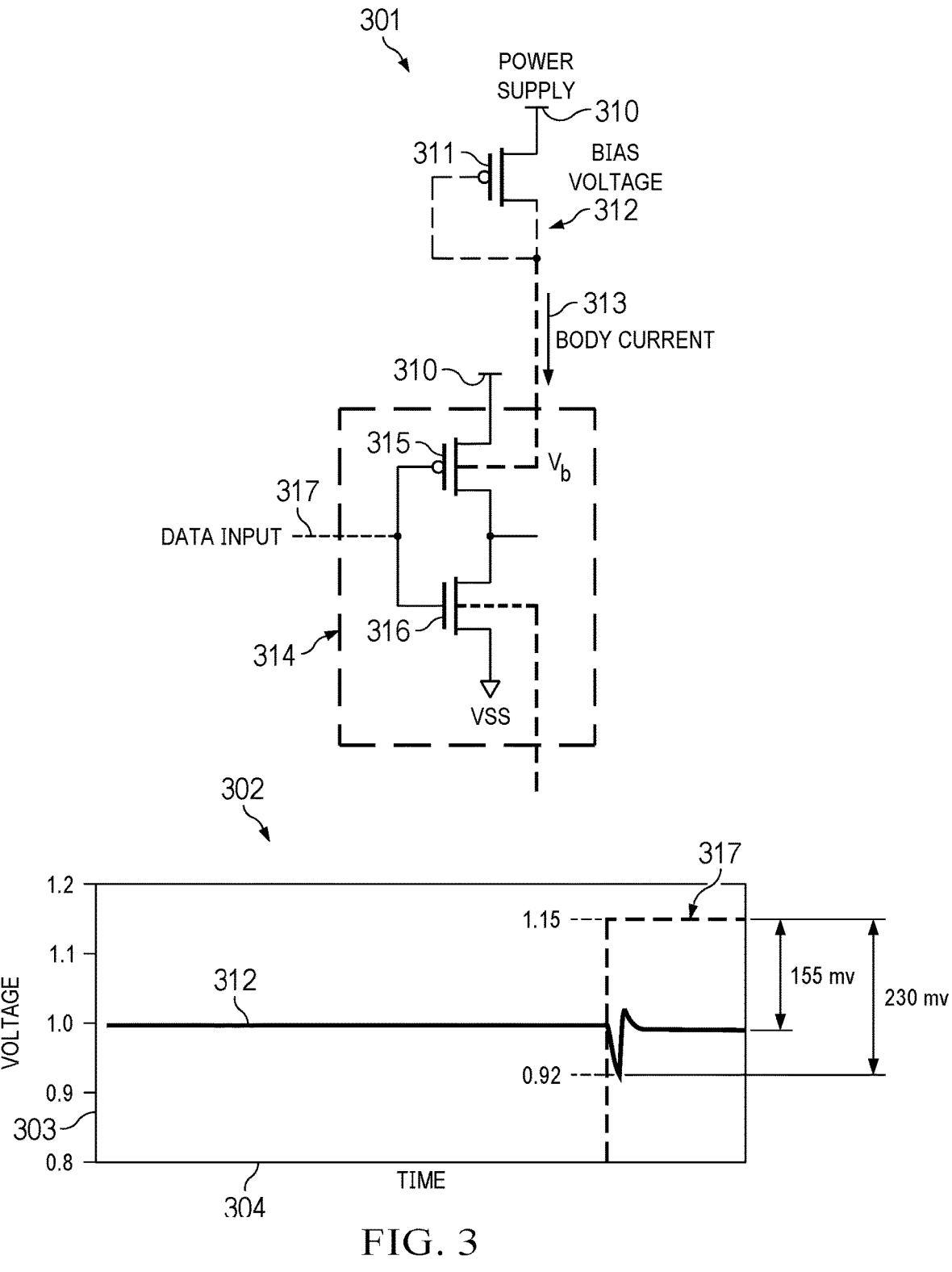
FIG. 3 illustrates an example aspect of components of a synchronizer flip-flop circuit and a related graphical representation of voltage changes of those components in accordance with an embodiment.

FIG. 3 illustrates an example aspect of components of a synchronizer flip-flop circuit and a related graphical representation of voltage changes of those components in accordance with an embodiment. FIG. 3 includes aspect 301, which includes diode-connected transistor 311 and latch inverter 314. FIG. 3 also includes graphical representation 302, which demonstrates voltage 303 over time 304 corresponding to a body voltage (i.e., bias voltage 312) of latch inverter 314 of aspect 301. Diode-connected transistor 311 and latch inverter 314 may be example components of a synchronizer flip-flop circuit (e.g., synchronizer flip-flop 100 of FIG. 1, synchronizer flip-flop 200 of FIG. 2), such as diode-connected transistor 113 of FIG. 1 or diode-connected transistor 213 of FIG. 2 and an inverter of primary latch sub-circuit 112 of FIG. 1 or primary latch sub-circuit 212 of FIG. 2, respectively.

Referring first to aspect 301, inverter 314 is representative of one inverter included in a latch sub-circuit (e.g., primary latch sub-circuit 112, secondary latch sub-circuit 117). Inverter 314 includes PMOS transistor 315 and NMOS transistor 316 coupled to each other. More specifically, PMOS transistor 315 includes a source coupled to receive a power from an internal power supply 310 (i.e., $V_{dd}$), a gate coupled with a gate of NMOS transistor 316 and coupled to receive input data 317 from a logic circuit or from another inverter in the latch sub-circuit, and a drain coupled to a drain of NMOS transistor 316 and further coupled to provide input data 317 downstream to another inverter or to a secondary latch sub-circuit. PMOS transistor 315 also includes a body coupled to a gate and a drain of diode-connected transistor 311.

Diode-connected transistor 311 is representative of an PMOS transistor that can generate a dynamic, n-channel well bias voltage 312 to influence operation of PMOS transistor 315 of inverter 314 of a synchronizer flip-flop circuit. While only diode-connected transistor 311 is shown in aspect 301, a second diode-connected transistor (e.g., a diode-connected NMOS transistor) may be included in various embodiments and coupled to provide a p-channel well bias voltage to influence the operation of NMOS transistor 316 of inverter 314. For the sake of brevity, the second diode-connected transistor is not shown nor discussed in aspect 301.

Diode-connected transistor 311 includes a source coupled to receive power from power supply 310 (i.e., $V_{dd}$), and a gate and drain coupled together and coupled to provide bias voltage 312 to the body of PMOS transistor 315. Based on power supply 310, diode-connected transistor 311 produces body current 313, which may be a reverse bias leakage current, and develops a voltage between the gate and drain of diode-connected transistor 311. Accordingly, bias voltage 312, measured at a node where the gate and drain of diode-connected transistor 311 are coupled, may be a value less than the voltage provided by power supply 310, as defined by the following equation where bias voltage is defined as $V_b$ and where $V_{SG}$ is the voltage across the source and gate of diode-connected transistor 311:

$$V_b = V_{dd} - V_{SG}.$$

As body current 313 flows to PMOS transistor 315, PMOS transistor 315 develops a non-zero voltage between the source and body of PMOS transistor 315 ($V_{sb}$). This voltage may be defined using the following equation:

$$V_{sb} = V_{dd} - V_b,$$

where $V_{sb}$ is less than the cut-in voltage of a source-body diode (not shown) of PMOS transistor 315. Accordingly, because the value of $V_{sb}$ is also less than $V_{dd}$, the threshold voltage ($V_{th}$) of PMOS transistor 315 may be reduced when bias voltage 312 is applied to PMOS transistor 315. This may cause the data resolution and latching speed of PMOS transistor 315 to increase. In various examples, the voltage of bias voltage 312, and consequently, $V_{sb}$ of PMOS transistor 315 may be determined based on characteristics of PMOS transistor 315 and diode-connected transistor 311.

Referring next to graphical representation 302 of FIG. 3, graphical representation 302 demonstrates voltage 303 of bias voltage 312 over time 304 and the influence of a change in state of input data 317 on bias voltage 312. During a static time where input data 317 is currently in the logical low state (i.e., "0") and does not change states for an amount of time 304, bias voltage 312 may have a constant voltage with a voltage drop of 155 mV from $V_{dd}$. In this static state, bias voltage 312 may generate a small amount of leakage, or body current 313 of PMOS transistor 315. However, at a time 304 when input data 317 changes states from the logical low state to the logical high state, or from "0" to "1," bias voltage 312 may decrease in voltage 303, which increases the voltage drop of bias voltage 312 to 230 mV. During this transition between states of input data 317, the voltage 303 of bias voltage 312 increases, which may increase body current 313 and $V_{sb}$ and decrease $V_{th}$ of PMOS transistor 315. Following the transition, at a subsequent time 304, bias voltage 312 can return to 155 mv, which may prevent excessive leakage from PMOS transistor 315 during non-transition, or static, times.

While only a transition from low to high is shown in graphical representation 302, a similar voltage drop increase of bias voltage 312 may be experienced when input data 317 transitions from the logical high state to the logical low state. It follows that Vth of PMOS transistor 315 may be dynamically changed only during transitions in logical state of input data 317 to increase efficiency of inverter 314 during such transitions. Further, such a voltage drop may occur by using an internal power supply (power supply 310) and without external power supplies that may provide a fixed bias voltage. Advantageously, not only is design area and cost reduced by using power supply 310, but also leakage of transistors 315 and 316 of inverter 314 is reduced and only dynamically changed when inverter 314 is tasked with latching a changed state value of input data 317.

Figure 4:
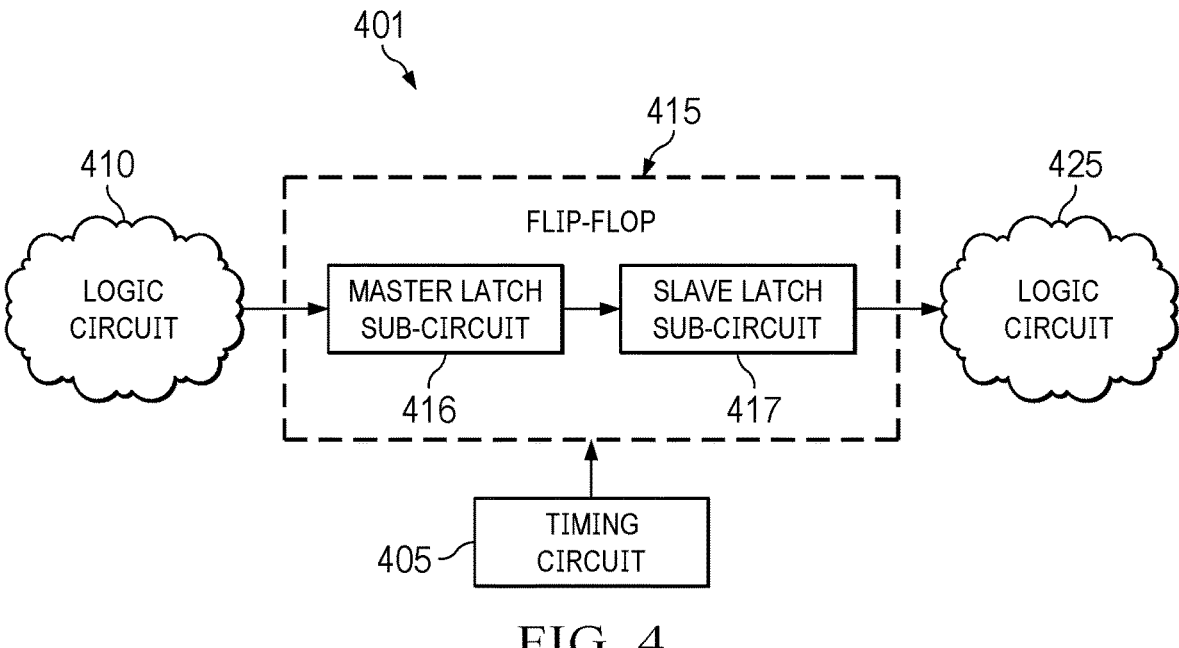
FIG. 4 illustrates an example operating environment for executing logic with a synchronizer flip-flop circuit in accordance with an embodiment.

FIG. 4 illustrates an example operating environment for executing logic with a synchronizer flip-flop circuit in accordance with an embodiment. FIG. 4 shows operating environment 400, which includes clock generator circuit 405, logic circuit 410, flip-flop 415, which includes primary latch sub-circuit 416 and secondary latch sub-circuit 417, and logic circuit 425. Flip-flop 415 may represent a synchronizer flip-flop circuit, such as synchronizer flip-flop 100 of FIG. 1, including multiple latches and other circuitry that can synchronize data signals across clock domains. For example, flip-flop 415 includes primary latch sub-circuit 416 and secondary latch sub-circuit 417. In various examples, primary latch sub-circuit 416 may include various elements, such as those shown and described with respect to primary latch sub-circuit 112 of FIG. 1 and primary latch sub-circuit 212 of FIG. 2. Similarly, secondary latch sub-circuit 417 may include various elements, such as those shown and described with respect to secondary latch sub-circuit 117 of FIG. 1 and secondary latch sub-circuit 223 of FIG. 2.

Logic circuit 410 is representative of a digital circuit, digital logic device, or combination or variation of electronic and logic elements capable of performing logic steps in accordance with a first clock signal. The first clock signal may or may not be the same clock signal as a second clock signal produced by clock generator circuit 405 (e.g., clock 104 of FIG. 1). Logic circuit 410 can produce a data signal by performing logic and provide the data signal, synchronized with the first clock signal, to flip-flop 415.

Flip-flop 415 is representative of a synchronizer flip-flop circuit that includes primary latch sub-circuit 416 and secondary latch sub-circuit 417 capable of synchronizing the data signal of logic circuit 410 with the second clock signal of clock generator circuit 405. Clock generator circuit 405 is representative of a clock generation circuit that may include an oscillator. Clock generator circuit 405 can provide the second clock signal to both primary latch sub-circuit 416 and secondary latch sub-circuit 417 which may allow components thereof to store states of the data signal.

Primary latch sub-circuit 416 is representative of a first, primary control latch including a first group of inverters that can control operations of secondary latch sub-circuit 417 based on the states of a data signal provided by logic circuit 410 and the second clock signal provided by clock generator circuit 405. Together, the inverters of primary latch sub-circuit 416 can receive the data signal from logic circuit 410, store a state value (e.g., "0" or "1") of the data signal, and provide the state value to secondary latch sub-circuit 417. Primary latch sub-circuit 416 can be configured to store a subsequent state value of the data signal when the state of the data signal changes to a different state relative to its stored state. In various examples, to resolve the data signal when it changes states, primary latch sub-circuit 416 may include diode-connected transistors (e.g., diode-connected transistors 113 and 114 of FIG. 1) that can provide bias voltages to inverters of primary latch sub-circuit 416 to improve the speed of the inverters. Following the latching of a new state of the data signal, primary latch sub-circuit 416 can provide the new state value to secondary latch sub-circuit 417 for storage.

Secondary latch sub-circuit 417 includes a second group of inverters and diode-connected transistors (e.g., diode-connected transistors 118 and 119 of FIG. 1) and can mimic the functionality of primary latch sub-circuit 416 with the exception that secondary latch sub-circuit 417 stores a state value of the data signal from logic circuit 410 according to primary latch sub-circuit 416. Following resolution and storage of state data of the data signal, secondary latch sub-circuit 417 may be coupled to provide the data signal, or a currently stored state value thereof, to logic circuit 425.

Logic circuit 425 is also representative of a digital circuit, digital logic device, or combination or variation of electronic and logic elements capable of performing logic steps in accordance with a third clock signal. In various examples, logic circuit 425 operates in accordance with a different clock signal relative to the first clock signal used by logic circuit 410. It follows that logic circuit 425 operates in a second clock domain relative to logic circuit 410. For example, logic circuit 425 may operate in accordance with the second clock signal generated by clock generator circuit 405 (i.e., the second clock signal may be the same as the third clock signal). Importantly, flip-flop 415 may be included in operating environment 401 to synchronize the data signal from logic circuit 410 to the clock domain of logic circuit 425 before the data signal is provided from logic circuit 410 to logic circuit 425. Logic circuit 425 can use the synchronized data signal to perform various operations and output a second data signal downstream to another logic circuit (not shown) or another flip-flop (not shown).

While some examples provided herein are described in the context of a synchronizer flip-flop circuit, sub-circuit, system, subsystem, component, device, architecture, or environment, it should be understood that the latches, flip-flops, logic elements, and other circuits, systems, and methods described herein are not limited to such embodiments and may apply to a variety of other processes, systems, applications, devices, and the like, such as other circuits, logic devices, latches, transistors, and the like, in the context of increasing transistor resolution efficiency, among other benefits, for example. Accordingly, aspects of the present invention may be embodied as other systems, methods, and other configurable systems.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A device, comprising:
a first latch sub-circuit including a first inverter that includes a first transistor of a first type and a second transistor of a second type, wherein the first transistor and the second transistor each includes a control terminal, and wherein the control terminals of the first and second transistors are coupled to each other and configured to receive an input signal;
a first diode-connected transistor including a current path terminal and a control terminal, wherein the control terminal is coupled to the current path terminal, both of which are coupled to a body of the first transistor to decrease a voltage of the body of the first transistor during a transition of the input signal; and
a second diode-connected transistor including a current path terminal and a control terminal, wherein the control terminal is coupled to the current path terminal, both of which are coupled to a body of the second transistor.

2. The device of claim 1, comprising:
a second latch sub-circuit including a second inverter that includes a third transistor of the first type and a fourth transistor of the second type, wherein the third transistor and the fourth transistor each includes a control terminal, and wherein the control terminals of the third and fourth transistors are coupled to each other;
a third diode-connected transistor including a current path terminal and a control terminal, wherein the control terminal is coupled to the current path terminal, both of which are coupled to a body of the third transistor; and
a fourth diode-connected transistor including a current path terminal and a control terminal, wherein the control terminal is coupled to the current path terminal, both of which are coupled to a body of the fourth transistor.

3. The device of claim 1, wherein the first type is an N-type MOSFET, and wherein the second type is a P-type MOSFET.

4. The device of claim 2, comprising:
a transmission gate configured to:
receive an output signal from the first latch sub-circuit; and
transmit, or block transmission of, the output signal to the second latch sub-circuit.

5. The device of claim 4, wherein:
the control terminals of the third and fourth transistors are configured to receive the output signal transmitted by the transmission gate; and
the third diode-connected transistor is configured to decrease a voltage of the body of the third transistor during a transition of the output signal.

6. The device of claim 5, wherein:
the first latch sub-circuit includes a third inverter that includes a fifth transistor and a sixth transistor, wherein the fifth transistor and the sixth transistor each includes a control terminal, and wherein the control terminals of the fifth and sixth transistors are coupled to each other and configured to receive an output signal from the first inverter;
the control terminal and the current path terminal of the first diode-connected transistor are coupled to a body of the fifth transistor; and the control terminal and the current path terminal of the second diode-connected transistor are coupled to a body of the sixth transistor.

7. The device of claim 6, wherein:
the second latch sub-circuit includes a fourth inverter that includes a seventh transistor and an eighth transistor, wherein the seventh transistor and the eighth transistor each includes a control terminal, and wherein the control terminals of the seventh and eighth transistors are coupled to each other and configured to receive an output signal from the second inverter;
the control terminal and the current path terminal of the third diode-connected transistor are coupled to a body of the seventh transistor; and
the control terminal and the current path terminal of the fourth diode-connected transistor are coupled to a body of the eighth transistor.

8. The device of claim 6, wherein the fifth transistor and the sixth transistor of the third inverter each includes a current path terminal, and wherein the current path terminals of the fifth and sixth transistors are coupled to the transmission gate.

9. The device of claim 5, wherein:
the first latch sub-circuit includes a third inverter that includes a fifth transistor and a sixth transistor, wherein the fifth transistor and the sixth transistor each includes a control terminal, and wherein the control terminals of the fifth and sixth transistors are coupled to each other and configured to receive the input signal;
the control terminal and the current path terminal of the first diode-connected transistor are coupled to a body of the fifth transistor; and
the control terminal and the current path terminal of the second diode-connected transistor are coupled to a body of the sixth transistor.

10. The device of claim 9, wherein:
the second latch sub-circuit includes a fourth inverter that includes a seventh transistor and an eighth transistor, wherein the seventh transistor and the eighth transistor each includes a control terminal, and wherein the control terminals of the seventh and eighth transistors are coupled to each other and configured to receive an output signal transmitted by the transmission gate;
the control terminal and the current path terminal of the third diode-connected transistor are coupled to a body of the seventh transistor; and
the control terminal and the current path terminal of the fourth diode-connected transistor are coupled to a body of the eighth transistor.

11. The device of claim 9, wherein the second transistor of the first inverter and the fifth transistor of the third inverter each includes a current path terminal, and wherein the current path terminals of the second and fifth transistors are coupled to the transmission gate.

12. The device of claim 2, comprising:
a transmission gate coupled in parallel with the first latch sub-circuit.

13. The device of claim 2, comprising:
a transmission gate coupled in parallel with the second latch sub-circuit.

14. The device of claim 1, comprising:
a transmission gate configured to:
receive the input signal; and
transmit, or block transmission of, the input signal to the first latch sub-circuit.

15. The device of claim 14, comprising:
a multiplexer configured to:

receive the input signal; and transmit the input signal to the transmission gate.

16. The device of claim 1, wherein the first diode-connected transistor further includes a second current path terminal coupled to a supply voltage, and wherein the second diode-connected transistor further includes a second current path terminal coupled to ground.

* * * * *